United States Patent [19]
Krone et al.

[11] Patent Number: 6,061,009
[45] Date of Patent: May 9, 2000

[54] APPARATUS AND METHOD FOR RESETTING DELTA-SIGMA MODULATOR STATE VARIABLES USING FEEDBACK IMPEDANCE

[75] Inventors: Andrew W. Krone; David R. Welland, both of Austin, Tex.

[73] Assignee: Silicon Laboratories, Inc., Austin, Tex.

[21] Appl. No.: 09/050,604

[22] Filed: Mar. 30, 1998

[51] Int. Cl.[7] .................................................. H03M 3/00
[52] U.S. Cl. ........................................ 341/143; 327/337
[58] Field of Search ..................................... 327/337, 143; 333/173; 375/257; 341/68, 143, 150, 172; 331/34

[56] References Cited

U.S. PATENT DOCUMENTS

| | | |
|---|---|---|
| 3,596,267 | 7/1971 | Goodman . |
| 3,654,560 | 4/1972 | Cath et al. . |
| 3,784,922 | 1/1974 | Blahut . |
| 4,720,688 | 1/1988 | Hasegawa et al. . |
| 4,851,841 | 7/1989 | Sooch . |
| 4,876,544 | 10/1989 | Kuraishi . |
| 4,888,587 | 12/1989 | Kuraishi . |
| 4,980,899 | 12/1990 | Troost et al. . |
| 5,012,244 | 4/1991 | Wellard et al. . |
| 5,272,451 | 12/1993 | Yamate et al. . |
| 5,376,834 | 12/1994 | Carobolante ............................ 327/143 |
| 5,384,808 | 1/1995 | Van Brunt et al. .................... 341/68 X |
| 5,644,257 | 7/1997 | Kerth et al. . |
| 5,654,984 | 8/1997 | Hershbarger et al. ................. 375/257 |
| 5,689,206 | 11/1997 | Schaller ................................... 327/337 |
| 5,736,895 | 4/1998 | Yu et al. ............................. 327/337 X |
| 5,856,766 | 1/1999 | Gillig et al. . |
| 5,870,046 | 2/1999 | Scott et al. ............................... 341/143 |
| 5,907,299 | 5/1999 | Green et al. . |

OTHER PUBLICATIONS

James C. Candy and Gabor C. Temes, "Oversampling Methods for A/D and D/A Conversion," IEEE Press, ISBN—0–87942–285–8, 1992, pp. 1–25.

D.R. Welland, B.P. Del Signore, and E.J. Swanson, and T. Tanaka, K. Hamashita, S. Hara, and K. Takasuka, "A Stereo 16–Bit Delta—Sigma A/D Converter for Digital Audio", Journal of the Audio Engineering Society, vol. 37, Jun. 1989, pp. 476–486.

Kirk C.–H. Chao, Shujaat Nadeem, Wai L. Lee and Charles G. Sodini, "A Higher Order Topology for Interpolative Modulators for Oversampling A/D Converters", IEEE Trans Circuits and Sys., vol. CAS–37, Mar. 1990, pp. 309–318.

James C. Candy, "A Use of Double Integration in Sigma Delata Modulation", IEEE Trans. Commun., vol. COM–33, Mar. 1985, pp. 249–258.

Paul R. Gray and Rinaldo Castello, "Chapter 10—Performance Limitations in Switched–Capacitor Filters", Design of MOS VLSI Circuits for Telecommunications—1985 Prentice–Hall, Englewood Cliffs, NY 07632, ISBN: 0–13–200643–X, pp. 314–333.

Adel S. Sedra, "Chapter 9—Switched–Capacitor Filter Synthesis", Design of MOS VLSI Circuits for Telecommunications—1985 Prentice–Hall, Inc., Englewood Cliffs, NJ 07632, ISBN: 0–13–200643–X, pp. 272–313.

*Primary Examiner*—Brian Young
*Assistant Examiner*—Patrick Wamsley
*Attorney, Agent, or Firm*—Davis & Johnson, LLP

[57] ABSTRACT

A technique for resetting state variables of a delta-sigma modulator of an analog-to-digital converter. A switched capacitor impedance is placed in the reset feedback path of an integrator to ensure that the integrator tracks to the proper reset voltage, when reset is initiated in a third-order or higher delta-sigma modulator.

30 Claims, 6 Drawing Sheets

APPARATUS AND METHOD FOR RESETTING DELTA-SIGMA MODULATOR STATE VARIABLES USING FEEDBACK IMPEDANCE

BACKGROUND OF THE INVENTION

1. Field of the Invention

The present invention relates to the field of analog-to-digital conversion and, more particularly, to a technique for resetting state variables in a delta-sigma modulator of an analog-to-digital converter.

2. Background of the Related Art

The general technique of providing analog-to-digital (A/D) or digital-to-analog (D/A) conversion of signals is well known in the art. Generally, the sampling rate required to sample an analog signal for A/D conversion must be twice the highest frequency component being sampled. This rate is known as the Nyquist rate. More recently, oversampling methods have been utilized for A/D and D/A conversion. In an oversampling type of converter, the sampling rate is much higher than the Nyquist rate. An oversampling technique is described in a reference titled "Oversampling Methods for A/D and D/A Conversion;" by James C. Candy and Gabor C. Temes; IEEE; pp. 1–25; 1992.

An advantage of using the oversampling technique is in the precision provided by the converter. With converters operating under the Nyquist rate for sampling, a certain amount of precision is required for the conversion. For example, in converting an analog signal into a 16-bit digital format, 16-bit precision is required. Accordingly, circuits will need to be designed having components which will meet this precision. In many instances, closely trimmed circuit components or precision matching (or compensating) circuits are required to meet the precision.

However, when sampling at a rate much higher than the required Nyquist sampling rate, the oversampling technique permits circuit precision to be relaxed significantly. For example, if the above A/D 16-bit oversampling converter implements an oversampling modulator, the modulator output can be a single bit output. The circuit precision needs only to meet this 1-bit output. Accordingly, closely trimmed circuit components are generally not needed. Additionally, 1-bit precision can be readily met by current generation CMOS (complementary-metal-oxide-semiconductor) components.

The disadvantage of using the oversampling technique is the added requirement that the output now needs to be reduced to the standard Nyquist rate at the eventual output of the converter. That is, the higher sampling rate now needs to be returned to the Nyquist rate. In the above 16-bit example, a multiple number of the 1-bit outputs will need to be combined to form a single 16-bit output, which output is equivalent to the 16-bit output from the Nyquist rate converter. However, the oversampling technique is preferred in many applications, since the cost savings in using less precise circuit components outweigh the additional digital signal processing needed at the back end of the converter.

One well known type of oversampling A/D conversion uses a modulator commonly referred to as a delta-sigma modulator. In a A/D converter (ADC) using a delta-sigma modulator, an integrator and a comparator are utilized at the front end of the converter to provide the quantization of the analog signal. Then, a low-pass filter and a decimator are utilized for digital signal processing to provide a corresponding digital signal at the Nyquist rate. However, the circuit precision of the analog circuitry can be relaxed, due to the use of the higher sampling rate.

When delta-sigma modulators are utilized, the modulator can be designed for higher than the first order of operation. Higher order operation of a delta-sigma modulator is desirable, since lower sampling rates can be utilized to obtain the same precision as operating the modulator at a lower order but with higher sampling rates. However, at higher order operation (notably, above the second order), stability is a significant concern. That is, the non-linear response of the delta-sigma comparator in the feedback path causes an unstable behavior. See "A Stereo 16-Bit Delta-Sigma A/D Converter for Digital Audio;" by D. R. Welland et al.; Journal of the Audio Engineering Society, vol. 37, pp. 476–486; June 1989; and "A Higher Order Topology for Interpolative Modulators for Oversampling A/D Converters;" by Kirk C.- H. Chao et al.; IEEE Trans. Circuits and Sys., vol. CAS-37, pp. 309–318; March 1990.

It is to be noted that the instability condition is different than an overload condition. In an overload condition, the modulator experiences a degraded signal-to-noise ratio when the input amplitude exceeds a certain value, but the modulator can recover when the overload condition is removed. Instability is also a function of the amplitude of the input signal, but in this instance (unlike the overload condition), the modulator cannot recover from an unstable behavior with the reduction of the input signal. Generally, instability occurs in third-order and higher systems. In order to return the system to its proper operating behavior, the state variables of the modulator need to be reset to values within a stable state space. Resetting the values to a zero condition will suffice.

In order to address the occurrence of an unstable condition in an order higher than the second order, a number of schemes have been devised. For example, in U.S. Pat. No. 5,012,244, an oscillation detect or is used to detect an occurrence of an oscillation condition in one of the integrator stages. The detection scheme is for the purpose of resetting the modulator once instability is sensed. Generally, a reset switch is placed across the input and output of the operational amplifier and the switch is closed to reset the integrator to a zero input condition. Resetting is necessary in third and higher order modulators, since recovery from an unstable condition is usually not possible with a reduction in the input signal amplitude. The present invention provides for an improved resetting scheme.

SUMMARY OF THE INVENTION

The present invention describes a technique for resetting state variables in a delta-sigma modulator of an analog-to-digital converter. Higher-order delta-sigma modulators operate at conditional stability. For third-order and higher modulators, some mechanism to reset the state variables to a zero state is required when the modulator enters into an unstable state. Once the modulator enters the unstable state, it usually cannot recover to resume normal operation, unless some other mechanism is used. In order to return the modulator to its proper operating behavior, a resetting scheme is used to reset the higher order state variable(s). The present invention provides for an improved technique to reset the state variables of a delta-sigma modulator.

In the preferred embodiment, an impedance in the form of a switched capacitor impedance is placed in the reset feedback path of an integrator. The coupling of the impedance in the reset feedback path ensures that the operational amplifier of the integrator stage operates as a lossy integrator, instead of as a unity gain amplifier when a simple reset switch is used. The impedance then causes the output node of the integrator to track or decay to a state variable value associated with the zero state condition.

A detection unit which is coupled to the output of the delta-sigma modulator detects the onset of the unstable condition and generates a signal to switch in the switched capacitor impedance into the reset feedback path of one or more of the integrator stages. The resetting circuitry places an impedance across the integrating capacitor of an integrator stage and tracks or decays the output to the zero state condition. The technique is employed in integrator stages where voltages are impressed onto the input and output nodes of the operational amplifier of the switched capacitor integrator stage(s) of the delta-sigma modulator.

DETAILED DESCRIPTION OF THE INVENTION

A technique for resetting one or more integrator stages in a delta-sigma modulator of an analog-to-digital converter is described. In the following description, numerous specific details are set forth, such as specific structures, materials, processes, etc., in order to provide a thorough understanding of the present invention. However, it will be appreciated by one skilled in the art that the present invention may be practiced without these specific details. In other instances, well known techniques and structures have not been described in detail in order not to obscure the present invention. It is to be noted that a preferred embodiment of the present invention is described in reference to the use of a switched capacitor impedance for resetting a state variable of a delta-sigma modulator ($\Delta\Sigma$). However, it is appreciated that the invention can be readily implemented in other ways to produce similar resetting results without departing from the spirit and scope of the present invention.

Figure 1:
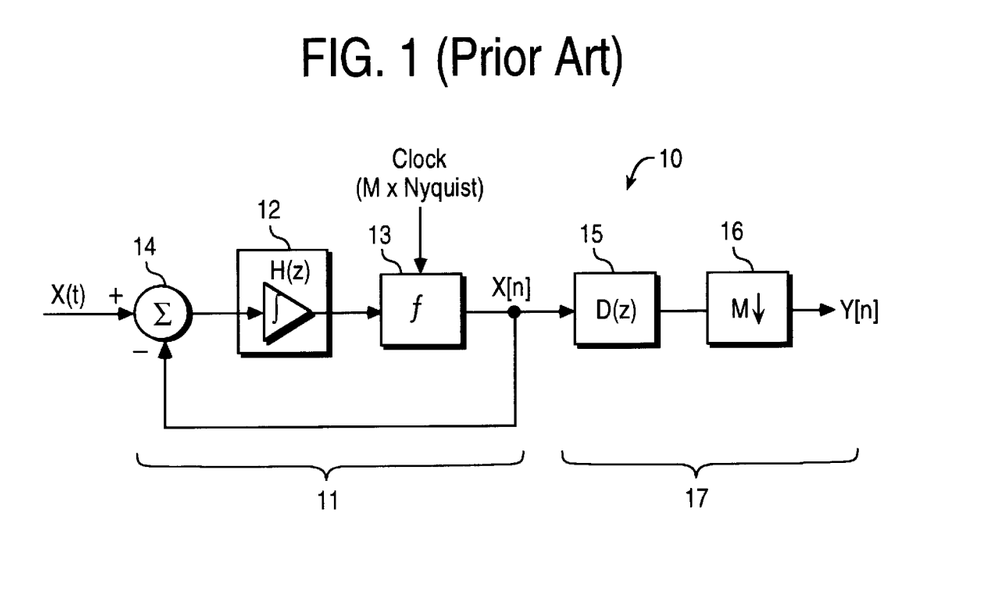
FIG. 1 is a block diagram of a prior art analog-to-digital converter using a delta-sigma modulator.

Referring to FIG. 1, a prior art analog-to-digital converter (ADC or A/D converter) 10 is illustrated. ADC 10 is of an oversampling type of converter utilizing a delta-sigma modulator 11 at the front end of the ADC 10. The delta-sigma modulator 11 is comprised of an integrator 12 and a comparator 13. An analog input signal x(t) is coupled as an input to the integrator 12 through a summing node or junction 14 (also referred to as a summer). The integrator provides an integrated output to the comparator 13. The comparator 13 is clocked at a sampling frequency which is M times the normal Nyquist rate, thereby providing the oversampling rate required of modulator 11. The output of the comparator 13 is a quantization signal x[n] which is coupled back in a feedback loop to the summing node 14 to subtract from the input signal at the input of the integrator 12. The operation of a delta-sigma modulator is well known and described in the references noted in the Background section above.

The back end of the ADC 10 is comprised of a decimation filter 17. The decimation filter 17 is typically comprised of a low-pass filter 15 (shown having function D(z)) and a decimator 16. The low-pass filter 15 passes the quantized signal but filters out the higher frequency quantization noise. The decimator 16 reduces the sample rate of the output signal from the digital low-pass filter 15 to provide the output y[n]. Again, the decimation technique is well known and described in the above-noted references.

Figure 2:
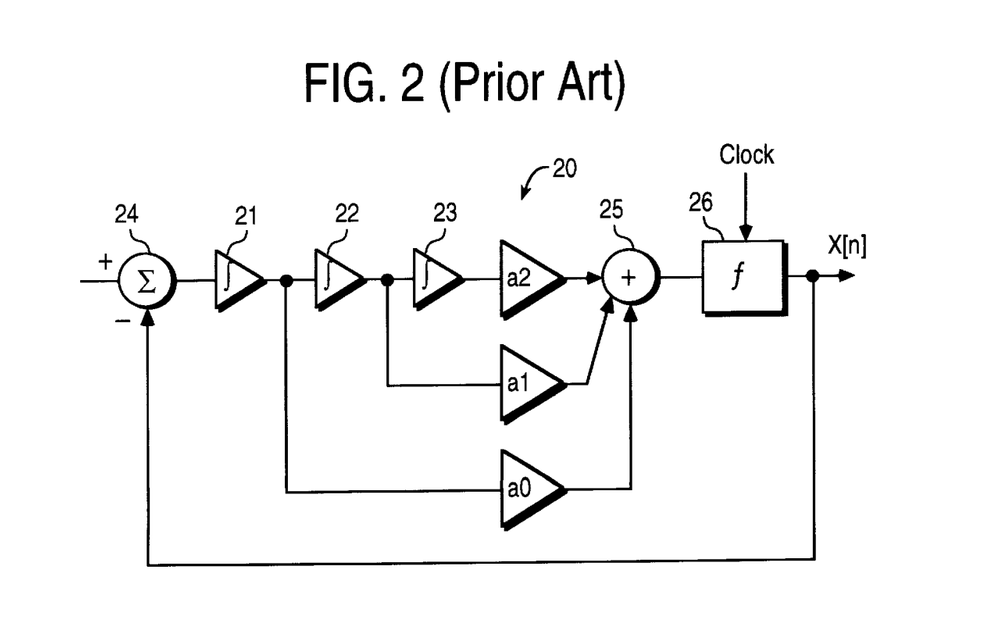
FIG. 2 is a block diagram of a third-order delta-sigma modulator showing the coefficients which relate to each of the three integrator stages.

FIG. 2 shows a delta-sigma modulator 20 which functions equivalent to the modulator 11 of FIG. 1. Whereas modulator 11 was of the first order, the delta-sigma modulator 20 is a higher order modulator. Specifically, it is a third order modulator, since it has three integrator stages in the loop. Accordingly, after an input summing node 24, three integrators 2–23 are coupled serially so that the output of each integrator is coupled as an input to the next integration stage. The output of each of the integrators 21–23 is referred to as a state variable and the outputs are coupled to a summing node 25 for summing the signals at the input of a comparator 26, which is clocked at the oversampling rate to quantize the signal. The operation of a higher order delta-sigma modulator is known in the art. See for example, "A use of Double Integration in Sigma Delta Modulation;" by James C. Candy, IEEE Trans. Commun., vol. COM-33, pp. 249–258, March 1985, as well as U.S. Pat. No. 5,012,244.

Each state variable can be scaled by the use of a multiplier, which is referred to as a coefficient. As noted in FIG. 2, each output of the integrators 21–23 fed forward to the summing node 25 has a respective coefficient noted as $a_0$, $a_1$ or $a_2$. The locations of the poles and zeros of the closed loop system determines the operating characteristic or behavior of the higher order modulator.

Figure 3:
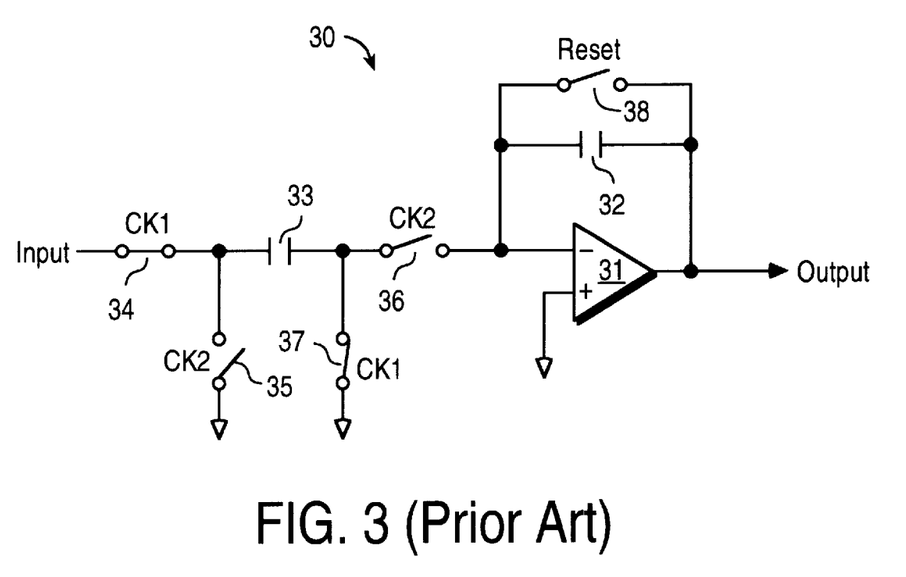
FIG. 3 is a circuit diagram of a switched capacitor integrator stage with reset, which is commonly used in the prior art for integrator stages of a delta-sigma modulator.

Referring to FIG. 3, a typical integrator circuit 30 known in the art is shown. The particular integrator is a switched capacitor type, wherein a switched capacitor network is present at the input of the integrator stage, which is comprised of an operational amplifier (op amp) 31 having an integrating capacitor 32 coupled in the feedback loop between the output and input of the op amp 31. The switching of a switched capacitor 33 is provided by switches 34, 35, 36 and 37. Generally, switches 34 and 37 are closed during one clock pulse (noted as CK1 in FIG. 3) to have the input signal charge the capacitor 33. During a different clock pulse (noted as CK2), switches 35 and 36 are closed to couple the stored signal to the minus input of the op amp 31. The feedback path of the capacitor 32 is also to this input of the op amp 31. Typically, the positive input of the op amp 31 is coupled to ground. Also shown in circuit 30 is a reset switch 38 coupled between the input and output nodes of the op amp 31. In normal operation, the reset switch 38 is open so that the op amp stage functions as an integrator. When the reset switch 38 is closed, the op amp stage operates as a unity gain amplifier.

The reset switch 38 is coupled to some type of a detection unit which monitors for the occurrence of an unstable condition. As noted, it is generally known that third-order or higher delta-sigma modulators can become unstable, when certain conditions are experienced, such as the input signal exceeding a certain amplitude value. The unstable condition of the system causes a distorted output signal. For example, oscillations are a result of this unstable condition. Sometimes, instability can occur at initial power up. Once an integrator stage becomes unstable, recovery may be difficult or impossible to achieve without intervention. That is, reducing the input signal amplitude alone will not return the system to its proper operating mode. Accordingly, a typical solution is to utilize a detection circuit to monitor for the occurrence of an unstable condition and when detected, the reset switch 38 is closed to reset the integrator stage to a zero condition. See for example U.S. Pat. No. 5,012,244 for the operation of the reset switch.

The closing of the reset switch 38 for the integrator(s) in a higher-order modulator causes the state variable(s) (for those stages being reset) to reset to the zero state, which should be a known stable state. Then, the reset switch 38 for each integrator being reset is opened, allowing the modulator to return to the normal mode of operation. However, it is appreciated that a difficulty arises when the zero or reset point of an integrator is a voltage not equal to the summing node voltage of the op amp. That is, instead of being coupled to ground, the switched capacitors and the summing node of the op amp are coupled to a voltage. This is illustrated and described below in reference to FIG. 4.

Figure 4:
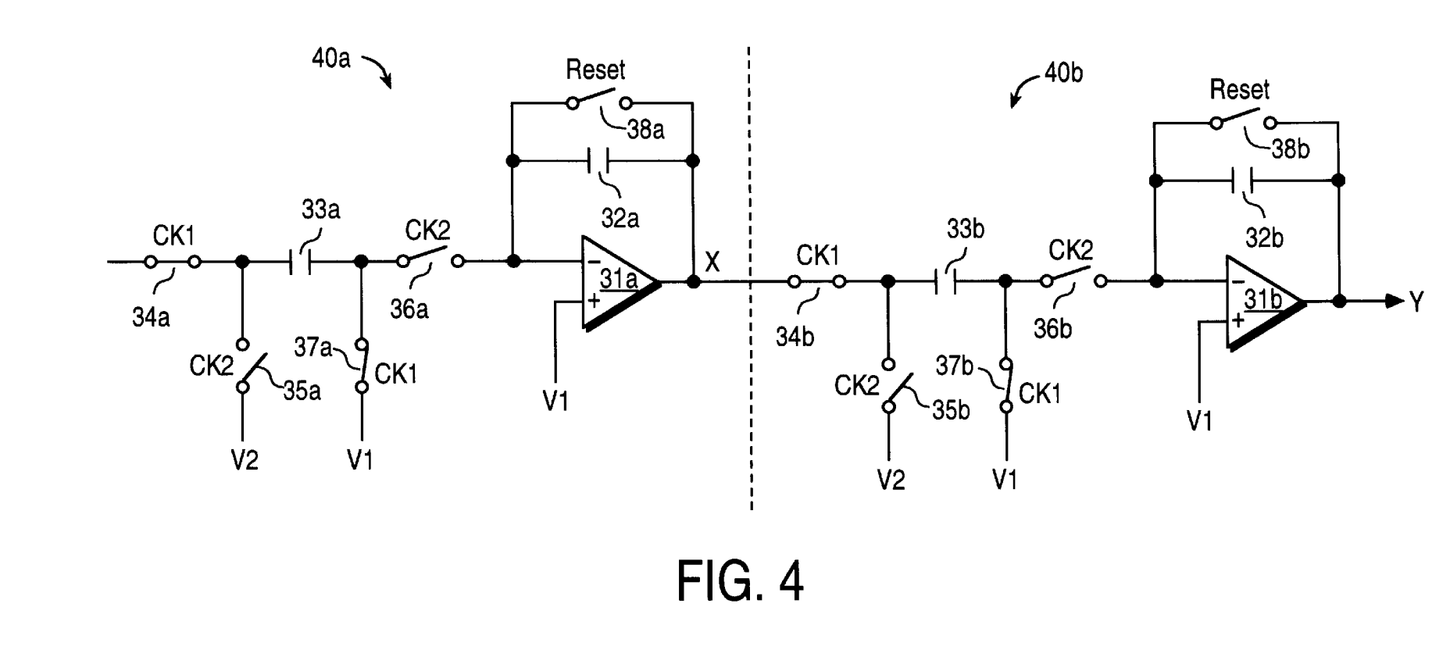
FIG. 4 is a circuit diagram of two stages of the switched capacitor integrators when voltages are impressed at the amplifier input and output nodes of the integrator stage.

Referring to FIG. 4, two stages of integrators 40a and 40b in a higher-order delta-sigma modulator is shown. Each of the stages 41a–b are comprised of an operational amplifier and its switched capacitor input circuitry, which are equivalent to the integrator stage of FIG. 3. Accordingly, the same reference designations are used as in FIG. 3, except for the addition of the suffix letters "a" and "b" to designate each of the separate stages in FIG. 4.

In FIG. 4, instead of the ground potential noted in FIG. 3, the circuit representation shows one side of the switched capacitors 33a–b being coupled to a voltage V2 through switch the switches 35a–b. Voltage V2 is the zero or reset point voltage for the op amp. The other side of the capacitors 33a–b are coupled to a voltage V1 through the switches 37a–b. The positive input of each op amp 31a–b is also coupled to V1. When a reset is initiated, it is desirable that the output of the op amp track to the reset voltage value of V2.

However, with the prior art resetting scheme, the reset switch 38 forces the op amp to operate as a unity-gain amplifier. Thus, a situation may arise where the output of the op amp tracks to the plus (+) input voltage of V1, instead of V2. For example, this situation may occur when there is a low voltage application where it may be difficult to have V1 at near mid-supply (0 volts), essentially the level of V2. The output of the op amp will then track to V1, instead of V2. It is possible that the state variable corresponding to V1 may not reside in the stable state space of the modulator. If V1 is not within the stable state space, the modulator will not be reset to the zero state and remain in an unstable state. Accordingly, in order to ensure that the modulator will always be reset to a stable reset state when V1 does not equal V2, some other mechanism (besides shorting across the integrating capacitor 32) is needed. The present invention implements an improved resetting scheme, in which a stable state variable reset is achieved.

Figure 5:
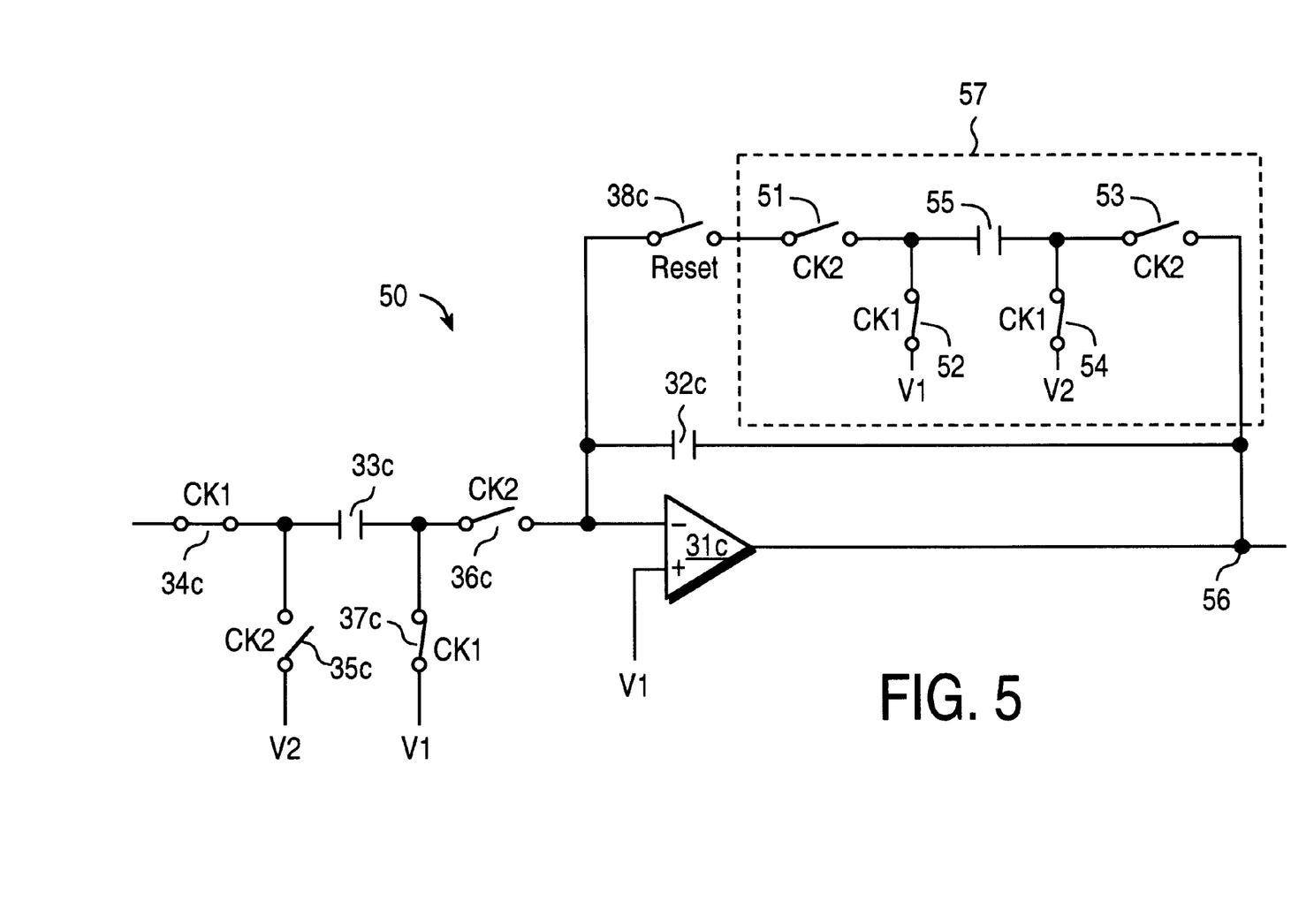
FIG. 5 is a circuit diagram of a switched capacitor integrator stage of the present invention in which a switched capacitor impedance is inserted in the reset path to decay the output of the integrator to a known stable value when reset is initiated.

Referring to FIG. 5, an integrator 50 of the present invention is shown having an improved reset circuitry 57. Again, as with the switched capacitor integrator circuit of FIG. 4, the integrator 50 utilizes a similar configuration. Thus, the integrator is comprised of the operational amplifier and its switched capacitor input circuitry of FIG. 4 and the same reference designations are used, except for the addition of the suffix letter "c" to designate those respective components in FIG. 5. The integrating capacitor 32c and the reset switch 38c are also present.

However, now there is present the additional circuitry 57, which is disposed in series with the reset switch 38c between the minus input (summing node) and the output node 56 of the op amp 31c. A purpose of circuit 57 is to introduce a lossy circuit (impedance) in the reset line of the integrator 50. Instead of an instantaneous shorting connection across the capacitor 32c with the closure of switch 38 (as shown in FIG. 4), the circuit 57 places an impedance in the reset feedback loop.

In the preferred embodiment, the impedance is a switched capacitor impedance. It is appreciated that a number of circuit configurations can be devised for the circuit 57 and that the switched capacitor impedance is but one preferred method. The embodiment shown in FIG. 5 is comprised of a capacitor 55 and four switches 51–54. Switches 51 and 53 are clocked by CK2, while switches 52 and 54 are clocked by CK1.

The clocking of the switches 51–54 results in the capacitor 55 to have a voltage V2–V1 impressed across it. When coupled to the summing node by the closure of the reset switch 38c, a voltage summation of the op amp becomes $$V1+(V2-V1)=V1-V1+V2=V2.$$

Accordingly, the output node (node 56) will always decay toward the voltage V2, which is the desired voltage for node 56 when reset is initiated. Thus, by placing a switched capacitor impedance in the reset feedback loop, it causes the integrator stage to become a lossy integrator, so that when a reset condition causes the reset switch 38c to close, the output node will decay toward the voltage V2 at a RC time constant determined by the impedance.

It is appreciated that the circuitry shown as the switched capacitor impedance is a circuit typically used for providing a low-pass filter function. See for example, Chapter 9 of Design Of MOS VLSI Circuits For Telecommunications titled "Switched-Capacitor Filter Synthesis" by Adel S. Sedra; Prentice-Hall; pp.272–313; 1985. The preferred embodiment utilizes this impedance to provide a lossy response in the reset loop of the integrator. However, other impedances can be readily substituted to provide this function.

The improved reset scheme of the present invention can be applied to all of the integrators stages to effect a reset of the complete modulator. However, it has been determined that the resetting need only be utilized past the second integrator for third-order or higher modulators. That is, all integrators beyond the second stage are reset using the circuit 57 of the present invention. By utilizing this technique, the third-order or higher modulator performs as a second order modulator when a reset is initiated, thereby ensuring a stable resetable condition. An application of such a technique is noted in FIG. 6.

Figure 6:
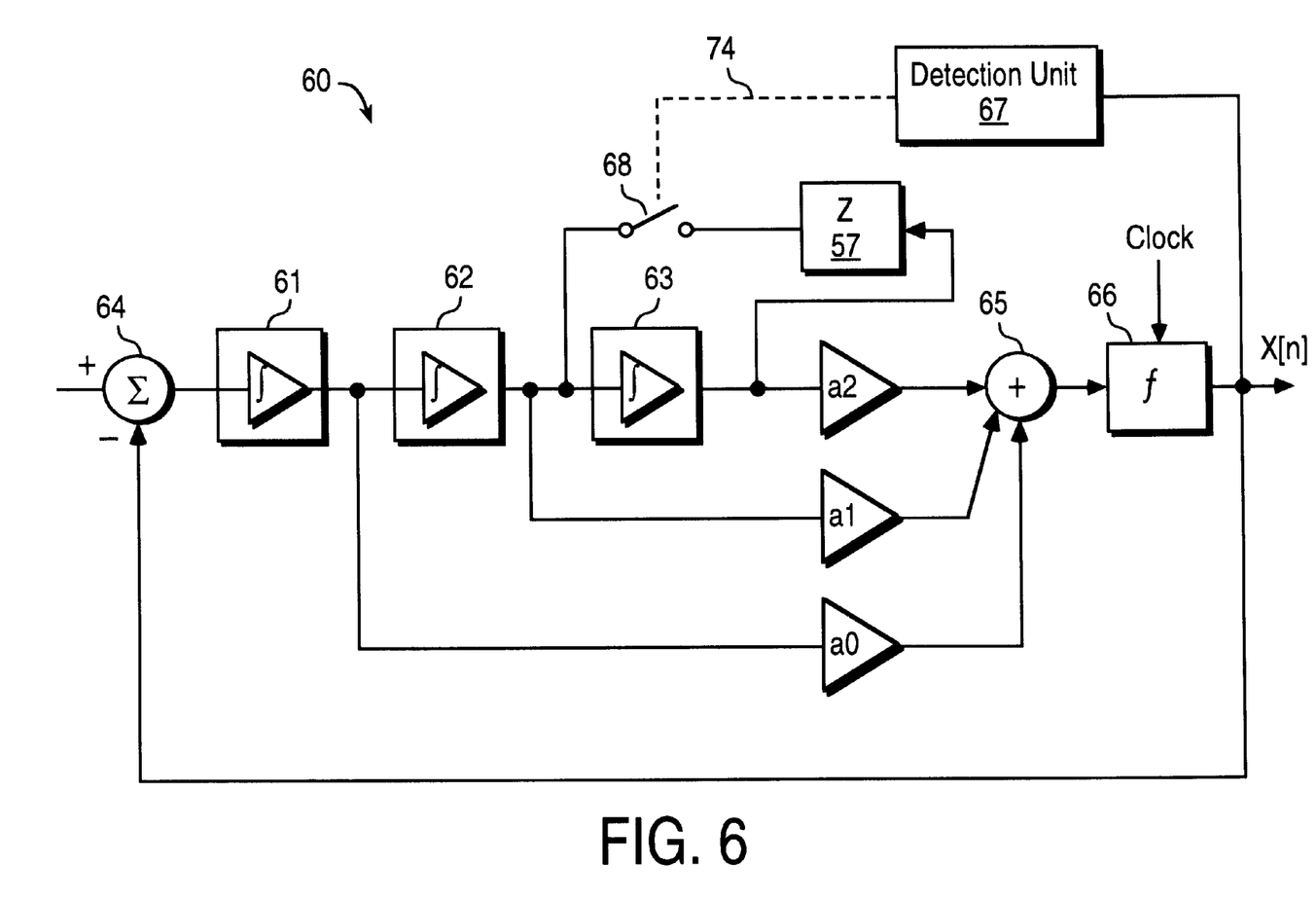
FIG. 6 is a block diagram of a third-order delta-sigma modulator of FIG. 2, but now incorporating the present invention and also in which a detection unit is used to switch in the switched capacitor impedance of the present invention in the reset feedback path.

In FIG. 6, a delta-sigma modulator 60 is shown. Modulator 60 is a third-order modulator when operating in its normal mode. Thus, modulator 60 has three stages of integrators 61–63 and is equivalent to the third-order modulator 20 of FIG. 2, with the exception of the additional element of the present invention. Summing nodes 64 and 65 and comparator 66 function equivalently to respective counterparts of FIG. 2. However, the modulator 60 incorporates the switched capacitor impedance in the feedback loop of the third integrator 63. The quantized signal x[n] is coupled as a feedback to the summing node 64.

In order to detect an unstable condition, a detection unit 67 is utilized. The detection unit 67 can be adapted from the prior art, such as the oscillation detection unit described in the afore-mentioned U.S. Pat. No. 5,012,244. It can also be adapted from the detection unit described in a copending patent application titled "Analog-To-Digital Conversion Overload Detection And Suppression" of Krone et al.; Ser. No. 09/050,316; filed Mar. 30, 1998; which is incorporated by reference herein.

The detection unit 67 can be coupled to any of the integrator stages, but as implemented herein, the detection input is obtained from the final output x[n] from the comparator 66. The detection unit 67 is used to monitor the condition which will cause the modulator to become unstable. When the modulator exhibits an unstable behavior, the detection unit triggers the action to close the reset switch(es). A reset signal 74 is then utilized to close the reset switch 68 (as well as reset switches of fourth and higher stages, if present) to place circuit 57 into the feedback loop. The reset switch remains closed until the detection unit has determined the instability condition is no longer present. In the preferred embodiment, the switched capacitor impedance ensures that the reset condition will always cause the third and higher stages to decay to the zero state voltage V2 at the output node of those integrator stages.

It is also appreciated that there are a number of ways the present invention can be implemented. In one system implementation, the delta-sigma modulator practicing the invention is incorporated into a communications circuitry, which includes an isolation barrier.

Figure 7:
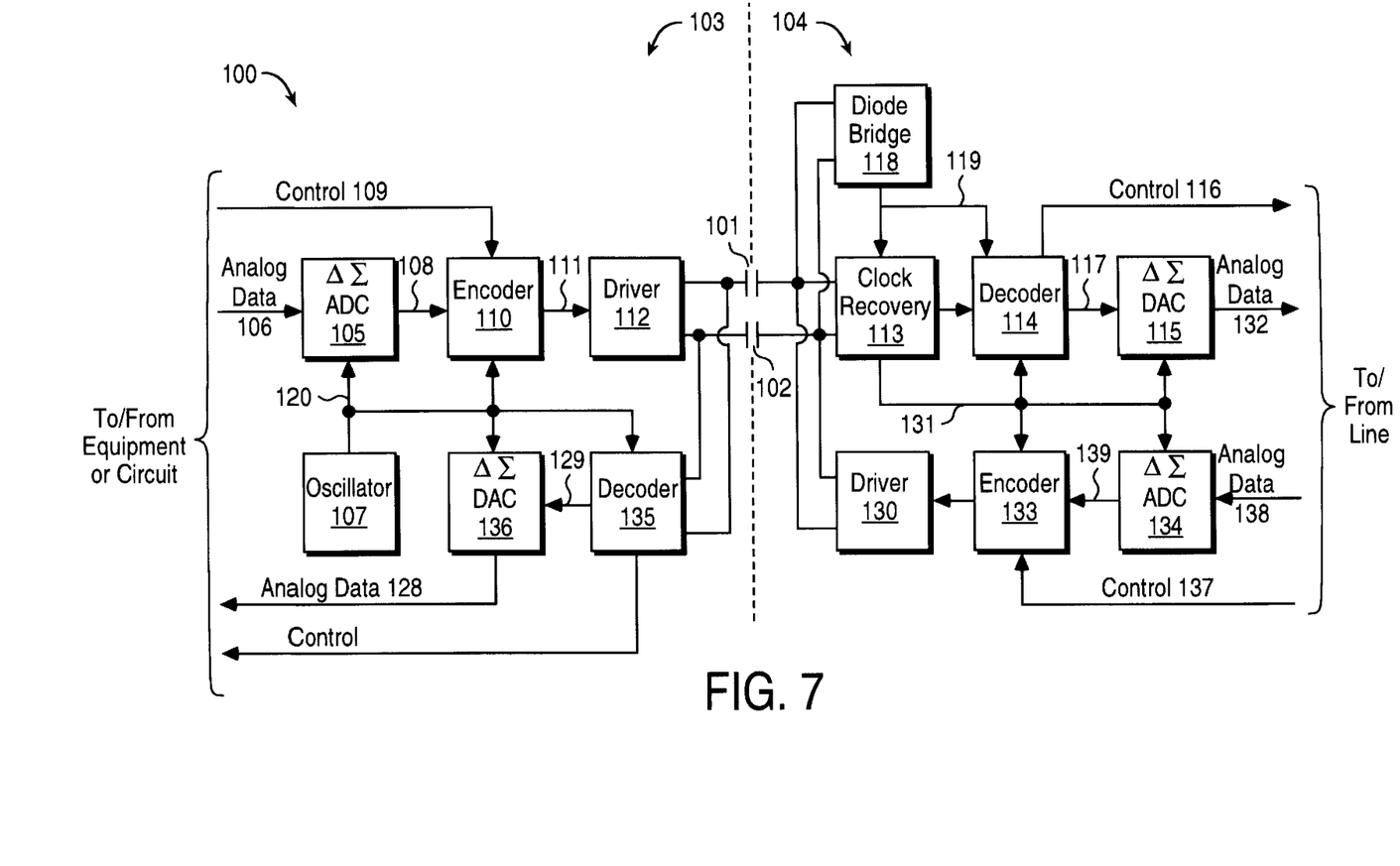
FIG. 7 is a block diagram of an example of an isolation system which incorporates the delta-sigma modulator of the present invention in its analog-to-digital converter.

Referring to FIG. 7, a capacitive isolation system 100, which includes a delta-sigma analog to digital converter implementing the present invention, is shown. The system 100 shown is a bidirectional system allowing data transfer in either direction. In the illustrated example, the capacitive isolation system is separated into a powered side or section 103 (shown to the left of the center dotted line) and a line side or section 104 (shown to the right of the center dotted line). The two sections are separated by the isolation barrier comprised of two high voltage capacitors 101 and 102. Note that the terms "powered" and "line" distinguish the side of the barrier containing AC powered circuitry and the side which is coupled to the communication line, which must be isolated from the powered circuitry or equipment. Isolation of this sort is used in a communication system, such as when AC powered circuitry or equipment is isolated from circuitry interfaced to a telephone line.

The powered section 103 includes a delta-sigma analog-to-digital converter 105 operable on the analog input 106 and synchronized to a clock signal 120 from an oscillator 107. The analog input 106 of the powered section is an analog signal containing information to be transferred across the isolation barrier, which may be for example an analog voice signal to be coupled to a telephone system. Digital output 108 of the delta-sigma ADC 105 may be time-division multiplexed with digital control input 109 by the encoder circuit 110. Digital control input 109 is a digital signal containing additional information to be transferred across the isolation barrier capacitors 101 and 102. The digital control input 109 may include control information for analog circuitry on the line side of the isolation barrier. The encoder circuit 110 also formats the resulting data stream into a coding scheme that allows for robust clock recovery on the line side of the isolation barrier. The encoder circuit 110 also receives the clock signal 120 from the oscillator 107. A driver circuit 112 of the powered section drives the encoded signal to the isolation capacitors 101 and 102 in response to the output 111 of the encoder circuit 110.

In one embodiment, capacitor 101 is driven bidirectionally by drivers 112 and 130 while capacitor 102 provides a return path across the isolation barrier. In another embodiment, capacitors 101 and 102 are differentially driven by digital driver circuits 112 and 130.

An embodiment of the line section, shown to the right of the isolation capacitors includes a clock recovery circuit 113, whose inputs are coupled to the isolation capacitors 101 and 102. The clock recovery circuit 113 recovers a clock signal from the digital data driven across the isolation barrier and provides synchronized clock signal 131 to the various circuits in the line section 104. The recovered clock operates as the time base for a decoder 114 and a delta-sigma digital-to-analog converter 115. The decoder 114 separates the time division multiplexed data and control information, providing digital control output 116 to other circuitry, as well as providing a synchronous data signal 117 as an input to the delta-sigma DAC 115.

The delta-sigma DAC 115, with digital input 117 supplied by the decoder 114, and clock signal 131 supplied by clock recovery unit 113, operates synchronously with the delta-sigma ADC 105 and provides an analog output 132. An active diode bridge 118 is coupled to the isolation capacitors 101 and 102 and supplies a DC power supply voltage to the clock recovery circuit 113 and the decoder 114 by drawing current from the digital signal transferred across the isolation barrier. The driver 130 remains tri-stated until the decoder 114 has detected a valid frame, indicating successful power-up of the line section circuitry.

The embodiment shown in FIG. 7 also enables communication from the line side 104 to the powered side 103, or from right to left across the isolation capacitors as illustrated. An encoder circuit 133 and the driver circuit 130 cooperate to communicate information back from the line side to a decoder circuit 135 in the powered section 103. The encoder 133 receives a clock input 131 from the clock recovery unit 113 and is thereby synchronized to the oscillator 107 and encoder 110. This synchronization allows information transfer in each direction to occur in distinct time slots. In time slots where the driver 112 is operable to transfer information from the powered side 103 to the line side 104, the driver 130 is tri-stated or disabled. Alternatively, in time slots where the line side driver 130 is operable to transfer information back from the line side 104 to the powered side 103, the driver 112 is tri-stated or disabled. In this manner, bidirectional communication may be established across a single pair of high voltage isolation capacitors 101 and 102.

Digital control input 137 of the line section 104 is a digital signal containing information to be communicated across the isolation barrier, including control information for analog circuitry on the powered side of the barrier. The line section 104 also includes a delta-sigma ADC 134 operable on an analog input signal 138, so that the information contained in the analog signal 138 can be conveyed across the barrier in digital form and then accurately reproduced on the powered side 103 of the barrier. The delta-sigma ADC 134 receives its clock input from the clock recovery circuit 113, and is thereby synchronized with the oscillator 107. The digital output signal 139 generated by the ADC 134 may be time-division multiplexed with the digital control input 137 in the encoder 133.

On the powered side 103, the decoder circuit 135 is coupled to the isolation capacitors 101 and 102 to receive signals therefrom and identify signals representing information coming from the line side. The decoder 135 then extracts the digital control information from the data stream received from the line side 104, and passes data signal 129 generated by the delta-sigma ADC 134 to a delta-sigma DAC 136.

The decoder 135 also latches and times the data received across the barrier to synchronize it with the clock signal 120, thereby eliminating the effects of phase noise interference and other sources of jitter in the synchronous digital signal. The clock input from the oscillator 107 ensures to synchronize the ADC 134 to DAC 136. The DAC 136 provides a reconstructed analog data output signal 128, thereby completing the communication of analog information transfer across the isolation barrier.

In summary, FIG. 7 describes a bidirectional communication system for conveying analog and digital information across a capacitive isolation barrier. The barrier itself is inexpensive, since only two high voltage isolation capacitors are required for synchronous, bidirectional communication. The barrier is a reliable communication channel because the digital signals communicated across the barrier are insensitive to amplitude and phase noise interference that may be introduced at the isolation barrier.

The system described above is described in a US patent application titled "Isolation System With Digital Communication Across A Capacitive Barrier;" Jeffrey W. Scott et al.; Ser. No. 08/841,409; filed Apr. 22, 1997; which is incorporated by reference herein. It is appreciated that the present invention can be utilized in a ADC in general. The ADC can be configured for use in a variety of systems. The isolation system described above is but one example.

In respect to the scheme of the present invention, it is implemented in the delta-sigma ADC 134 in FIG. 7. The invention can also be implemented in the delta-sigma ADC 105. Thus, the use of the present invention in a system's environment is described. As noted, the system's environment is described herein as an example of how a delta-sigma analog-to-digital converter of the present invention can be utilized in a system setting.

Thus, an improved technique for resetting a delta-sigma modulator in an analog-to-digital converter is described. The resetting scheme of the present invention uses an impedance in the reset path to ensure that the output node of the integrator tracks or decays to the proper zero state variable value at reset. Further, this impedance is described as a switched capacitor impedance in the preferred embodiment, but other impedance implementations can be used without departing from the spirit and scope of the present invention.

We claim:

1. An apparatus for resetting a state variable output of an integrator stage of a modulator utilized in an analog-to-digital converter when an unstable condition is detected comprising:
    a reset switch coupled in a reset feedback path between an input and an output of the integrator stage;
    an impedance coupled in series with the reset feedback path between the input and output of the integrator stage, wherein activation of the reset switch inserts said impedance in the reset feedback path; and
    said impedance causing the integrator stage to operate as a lossy integrator and to prevent the integrator from operating as a unity gain amplifier to ensure that the state variable output of the integrator stage tracks to a desired stable reset state.

2. The apparatus of claim 1 wherein the integrator stage includes a switched capacitor input circuit coupled to a first input of an operational amplifier of the integrator stage and in which the first input is the same input coupled to the reset feedback path; said operational amplifier having a first voltage impressed at its other input and which the first voltage is different from a second voltage associated with the stable reset state.

3. The apparatus of claim 2 wherein said impedance is a switched capacitor impedance.

4. The apparatus of claim 1 wherein the integrator stage includes a switched capacitor input circuit coupled to a negative input of an operational amplifier of the integrator stage and in which the negative input is the same input coupled to the reset feedback path; said operational amplifier having a first voltage impressed at its positive input and which the first voltage is different from a second voltage associated with the stable reset state.

5. The apparatus of claim 4 wherein said impedance is a switched capacitor impedance in which a capacitor and two switches of the switched capacitor impedance are coupled in series with said reset switch, one side of the capacitor coupled to the negative input is also coupled to the first voltage through a third switch, and the other side of the capacitor coupled to the output is also coupled to the second voltage, through a fourth switch.

6. The apparatus of claim 1, wherein the impedance is comprised of a capacitor.

7. In an analog-to-digital converter, a modulator for converting an analog signal to a digital signal comprising:
    a plurality of integrator stages coupled serially to provide a delta-sigma modulator configuration which is higher than a second-order of operation;
    a reset switch coupled in a reset feedback path between an input and an output of one of the integrator stages beyond a second level to reset its state variable to a stable reset state;
    an impedance coupled in series with said reset switch and also coupled between the input and output of the integrator stage, wherein activation of the reset switch inserts said impedance in the reset feedback path; and
    said impedance causing the integrator stage to operate as a lossy integrator and to prevent the integrator from operating as a unity gain amplifier to ensure that the output of the integrator stage tracks to a desired stable reset state.

8. The modulator of claim 7 wherein the integrator stage having the reset includes a switched capacitor input circuit coupled to a first input of an operational amplifier of the integrator stage and in which the first input is the same input coupled to the reset feedback path; said operational amplifier having a first voltage impressed at its other input and which the first voltage is different from a second voltage associated with the stable reset state.

9. The modulator of claim 8 wherein said impedance is a switched capacitor impedance.

10. The modulator of claim 9 wherein the reset switch and the impedance are provided for all stages beyond the second stage so that all stages beyond the second stage have their state variables reset to the stable reset state.

11. The modulator of claim 7 wherein the integrator stage having the reset includes a switched capacitor input circuit coupled to a negative input of an operational amplifier of the integrator stage and in which the negative input is the same input coupled to the reset feedback path; said operational amplifier having a first voltage impressed at its positive input and which the first voltage is different from a second voltage associated with the stable reset state.

12. The modulator of claim 11 wherein said impedance is a switched capacitor impedance in which a capacitor and two switches of the switched capacitor impedance are coupled in series with said reset switch, one side of the capacitor coupled to the negative input is also coupled to the first voltage through a third switch, and the other side of the capacitor coupled to the output is also coupled to the second voltage.

13. The modulator of claim 12 wherein the reset switch and the impedance are provided for all stages beyond the second stage so that all stages beyond the second stage have their state variables reset to the stable reset state.

14. The analog-to-digital converter of claim 7, wherein the impedance is comprised of a capacitor.

15. A method of resetting a state variable output of an integrator stage of a modulator utilized in an analog-to-digital converter when an unstable condition is detected, but ensuring that a reset condition places the state variable in a stable state for integrator stages operating with non-grounded inputs, comprising the steps of:;
   detecting an occurrence of an unstable state of the modulator
   activating a reset condition in response to the detecting of the unstable state;
   inserting an impedance between the input and output of the integrator stage when the reset condition is activated to cause the integrator to operate as a lossy integrator and to prevent the integrator stage from operating as a unity gain amplifier to ensure that the output of the integrator stage tracks to a desired stable reset state.

16. The method of claim 15 wherein the inserting step further includes inserting a switched capacitor impedance between the input and output of the operational amplifier of the integrator stage.

17. The method of claim 15, wherein the impedance inserted is provided by a capacitor.

18. A communication system, in which a non-AC powered circuitry is coupled to a transmission medium and in which isolation is required between the non-AC powered circuitry and an AC powered circuitry, for receiving an analog signal from one or the other side of the isolation barrier, converting the analog signal to a digital signal and transferring a digital signal across the isolation barrier comprising:
   a capacitive barrier coupled to the AC powered circuitry and non-AC powered circuitry for providing isolation between the two circuitry; and
   an analog-to-digital converter in one of said circuitry coupled to receive the analog signal, convert it and transfer a digital signal across said capacitive barrier, said analog-to-digital converter comprising:
      (a) a modulator comprised of a plurality of integrator stages coupled serially to provide a delta-sigma modulator configuration which is higher than a second-order of operation;
      (b) a reset switch coupled in a reset feedback path between an input and an output of one of the integrator stages beyond a second level to reset its state variable to a stable reset state;
      (c) an impedance coupled in series to said reset switch and also coupled between the input and output of the integrator stage, wherein activation of the reset switch inserts said impedance in the reset feedback path; and
      said impedance causing the integrator stage to operate as a lossy integrator and to prevent the integrator from operating as a unity gain amplifier to ensure that the output of the integrator stage tracks to a desired stable reset state.

19. The communication system of claim 18 wherein the integrator stage having the reset includes a switched capacitor input circuit coupled to a first input of an operational amplifier of the integrator stage and in which the first input is the same input coupled to the reset feedback path; said operational amplifier having a first voltage impressed at its other input and which the first voltage is different from a second voltage associated with the stable reset state.

20. The communication system of claim 19 wherein said impedance is a switched capacitor impedance.

21. The communication system of claim 20 wherein the reset switch and the impedance are provided for all stages beyond the second stage so that all stages beyond the second stage have their state variables reset to the stable reset state.

22. The communication system of claim 18 wherein the integrator stage having the reset includes a switched capacitor input circuit coupled to a negative input of an operational amplifier of the integrator stage and in which the negative input is the same input coupled to the reset feedback path; said operational amplifier having a first voltage impressed at its positive input and which the first voltage is different from a second voltage associated with the stable reset state.

23. The communication system of claim 22 wherein said impedance is a switched capacitor impedance in which a capacitor and two switches of the switched capacitor impedance is coupled in series with said reset switch, one side of the capacitor coupled to the negative input is also coupled to the first voltage through a third switch, and the other side of the capacitor coupled to the output is also coupled to the second voltage.

24. The communication system of claim 23 wherein the reset switch and the impedance are provided for all stages beyond the second stage so that all stages beyond the second stage have their state variables reset to the stable reset state.

25. The communication system of claim 15, wherein the impedance is comprised of a capacitor.

26. An apparatus for resetting state variables of an integrator stage in a modulator of an analog-to-digital converter comprising:
   a reset switch; and
   an impedance connected in series with the reset switch, wherein the series combination of the reset switch and impedance is connected between an input and an output of the integrator stage forming a feedback path between the input and the output through the impedance and the reset switch, and wherein activation of the reset switch connects the feedback path between the input and the output of the integrator stage.

27. The apparatus of claim 26, further comprising a second switch connected in series with the reset switch and the impedance, wherein the impedance is connected between the reset switch and the second switch.

28. The apparatus of claim 27, further comprising:
   a third switch connected between a first voltage and the junction formed by the reset switch and the impedance; and
   a fourth switch connected between a second voltage and the junction formed by the impedance and the second switch.

29. The apparatus of claim 28, wherein the integrator stage includes a switched capacitor input circuit coupled to a first input of an operational amplifier of the integrator stage and in which the first input is the same input coupled to the impedance, said operational amplifier having the first voltage impressed at a second input, and wherein the first voltage is different from the second voltage.

30. The apparatus of claim 26, wherein the impedance is comprised of a capacitor.

* * * * *